United States Patent [19]

Scari et al.

[11] Patent Number: 5,807,793

[45] Date of Patent: Sep. 15, 1998

[54] LAMINATES FOR PRINTED CIRCUITS USING UNIDIRECTIONAL GLASS FABRIC

[75] Inventors: Diego Armando Scari; Marco Scari, both of Brugherio, Italy

[73] Assignee: Gividi Italia S.p.A., Milan, Italy

[21] Appl. No.: 755,630

[22] Filed: Nov. 25, 1996

[30] Foreign Application Priority Data

Oct. 25, 1996 [EP] European Pat. Off. ............ 96830545

[51] Int. Cl.⁶ .......................... B29C 67/14; B29C 53/80; H05K 1/00

[52] U.S. Cl. .......................... 442/60; 442/203; 442/208; 139/420 C; 139/420 R; 139/426 R; 428/902; 428/901

[58] Field of Search ................................. 442/60, 61, 203, 442/208; 139/420 C, 420 R, 426 R; 428/902

[56] References Cited

U.S. PATENT DOCUMENTS

| | | | |
|---|---|---|---|
| 3,595,730 | 7/1971 | Richardson, Jr. et al. | 161/89 |
| 3,660,199 | 5/1972 | Riccitiello et al. | 428/901 |
| 4,751,146 | 6/1988 | Maeda et al. | 428/901 |
| 5,269,863 | 12/1993 | Middelman | 156/177 |

FOREIGN PATENT DOCUMENTS

| | | |
|---|---|---|
| 0 700 237 | 3/1996 | European Pat. Off. . |
| 42 26 208 | 2/1994 | Germany . |
| 96/02692 | 2/1996 | WIPO . |
| 96/09158 | 3/1996 | WIPO . |

*Primary Examiner*—Cathy F. Lam
*Attorney, Agent, or Firm*—Griffin, Butler Whisenhunt & Szipl

[57] ABSTRACT

A description is provided of laminates for printed circuits using unidirectional glass fabric produced with continuous yarn which is twisted, has a low number of twists or zero twisting turns with different gramme weights, interlaced warpwise with a leno interwoven binding using glass yarns of 5.5 to 22 Tex at a spacing of up to 20 cm. The application of these laminates to the manufacture of printed circuits offers advantages in terms of surface roughness and waviness, dimensional stability, evenness and perforability.

12 Claims, 3 Drawing Sheets

LAMINATES FOR PRINTED CIRCUITS USING UNIDIRECTIONAL GLASS FABRIC

The present invention relates to laminates for printed circuits, in particular sheets of glass-reinforced resin (GRR) comprising unidirectional glass fabric transformed into sheets by means of impregnation with still not entirely hardened epoxy resin (pre-preg B-stage) which, when placed on top of each other in a crossed arrangement and after pressing and baking of the resin, are transformed into a laminate mainly used as a substrate for a printed circuit (PWB).

BACKGROUND OF THE INVENTION

The dielectric laminates used in the construction of printed circuits (PWB) are mainly made using glass fabric and epoxy resin.

The combination of glass and resin gives rise to a structural material which fully satisfies the characteristics required by the wide range of applications in the electronic components market.

However, continuous improvements to glass-reinforced resin laminates are required owing to the technological evolution which is marked in particular by the miniaturisation of electronic devices and the smaller thickness and greater concentration of copper tracks on printed circuits.

In particular, at the present time, improvements to the following characteristics of laminates are required: surface, surface roughness and waviness, dimensional stability, evenness and perforability.

The standard glass fabric normally used for sheets is starting to show the first signs of poor adaptability to the qualitative improvements required by the market.

The electronics market, moreover, is also unable to cope with substantial increases in the cost of the product, which has now become a mass-produced article. Consequently all those solutions which radically alter the manner of constructing PWB sheets have become unattractive.

Some original methods for the solution of the problems have been proposed as an alternative to the application of glass fabric as a base for the construction of laminates, but all of them have some basic drawbacks.

European Patent 0.478.051 describes a method for the continuous manufacture of a flat layer constructed with the deposition, in alternate 0°/90° directions, of only resin-impregnated fibers.

The system has technical aspects which are not particularly positive, since that the the fibers must be kept tightly tensioned for the entire duration of the process and the apparatus is particularly unproductive, very complex and involves the use of complex and costly machinery.

European Patent 93 01919 also describes a method for the manufacture of laminates formed by the joining and continuous moulding of fibers preimpregnated with resin; however, the system, as in all the systems which propose the sole use of preimpregnated yarns, has the drawback that it does not allow good moulding pressures, resulting in the trapping of microscopic voids inside the printed sheets, with a consequent deterioration in the electrical characteristics. Further problems of deterioration in the electrical characteristics may be determined from the appearance of flaws along the filaments completely devoid of intersections. The system, moreover, is cumbersome and requires a completely new plant design.

Italian Patent application MI96A 000237, filed on 8 Feb. 1996 in the name of the present applicant, describes a unidirectional glass fabric (UDF) produced with a continuous yarn which is twisted, has a low number of twists or zero twisting turns, with different gramme weights and interlaced with thin glass yarns by way of a binding. This fabric allows the manufacture of laminates for printed circuits, which satisfy the requirements of progressive miniaturisation. In this application the use of unidirectional glass fabric for the manufacture of glass-reinforced resin laminates for printed circuits is described. However, no details are given as regards the orientation of the fibers enabling the aforementioned problems to be overcome.

SUMMARY OF THE INVENTION

It has now been discovered that by arranging the various layers of unidirectional glass fabric with an alternating 0° and 90° orientation in particular relationships, it is possible to obtain glass-reinforced resin sheets (laminates) which allow the construction of printed circuits which satisfy the requirements of low surface roughness, dimensional stability and processability of the laminate.

Therefore, the present invention relates to sheets (laminates) of glass-reinforced resin composed of undirectional glass fabric produced with continuous yarn which is twisted, has a low number of twists or zero twisting turns with different gramme weights, interlaced warpwise with a leno interwoven binding using glass yarns of 5.5 to 22 Tex at a spacing of up to 20 cm, characterized in that the orientation of the fibers in the laminate is from 50 to 80% of fibers at 0° and from 50 to 20% of fibers at 90°.

The present invention also relates to a method for the manufacture of said sheets.

The present invention further relates to the use of said sheets (laminates) as a dielectric support in the construction of printed circuits.

The present invention includes printed circuits comprising dielectric laminates according to the present invention, in particular the printed circuits used in high-frequency technology.

BRIEF DESCRIPTION OF THE DRAWINGS

The invention will now be described in greater detail, also by means of the figures in which.

DETAILED DESCRIPTION OF THE INVENTION

Figure 1:
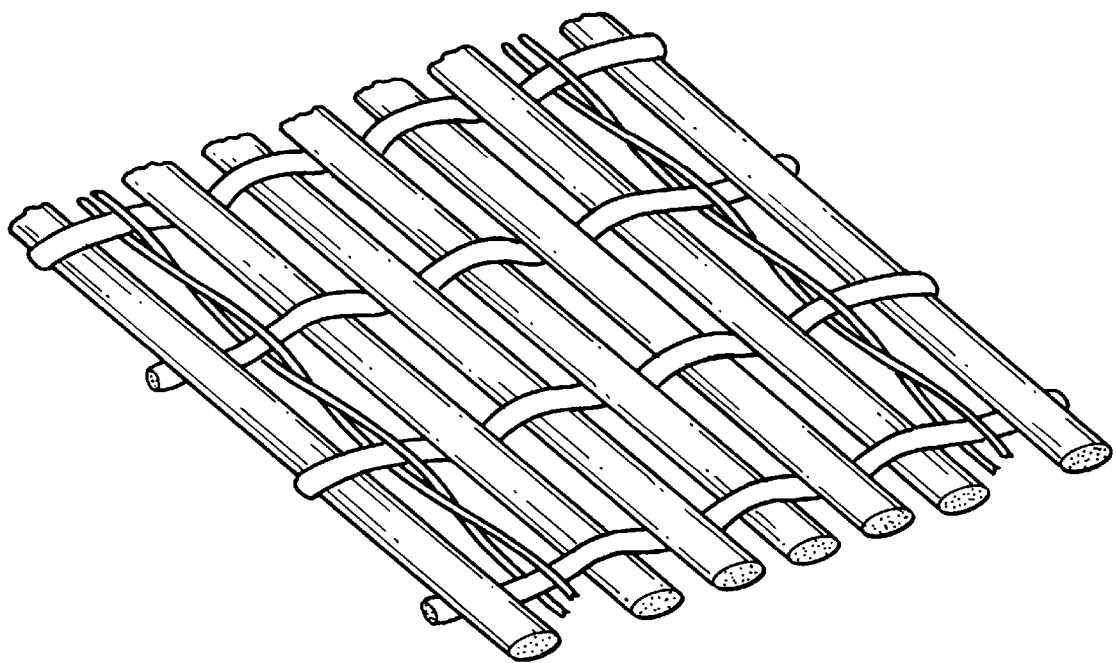
FIG. 1 shows in schematic form an axonometric view of a unidirectional fabric used in the present invention.

In the unidirectional fabric used according to the present invention, interlacing warpwise is obtained using glass yarns of 5.5 to 22 Tex.

The two yarns lie, in pairs, next to the bottom yarns and are not visible on the fabric. In the fabric these yarns are interlaced with the wefts, being alternately located on the first weft on the upper right-hand side and on the second weft on the bottom left-hand side, resulting in a binding well known to textile experts by the name of "leno interwoven". With insertion of the binding yarns which will be referred to as "interlacings", stabilisation of the bottom yarns is obtained, which allows handling of the unidirectional fabric without slipping of the yarns which could give rise to overtensioning and very severe distortion during the subsequent impregnation phase. The yarns thus remain perfectly aligned with one another and uniformly tensioned, thus avoiding becoming displaced, superimposed or bunched together under the moulding pressures occurring in the standard technological process used nowadays and resulting in a uniform resin/glass ratio in the mass of the laminate.

Preferably the ratio by weight of the yarn arranged warpwise should be at least 90% of the total weight of the fabric.

The interlacings may be arranged at a maximum distance from one another of 20 cm, preferably at a distance of between 10 and 15 cm and a number of wefts up to 8 per cm.

The yarn which forms the fabric is formed by conventional filaments, preferably with a diameter of between 5 and 13 microns.

In a preferred embodiment, the yarn has a Tex value of between 22 and 136.

A particularly preferred embodiment envisages a unidirectional fabric with a warp having a value of between 22 and 136, preferably 74 Tex, the weft with a value of between 11 and 34, preferably 22 Tex, and the interlacings with a value of between 5 and 22, preferably 11 Tex.

In the sheets for printed circuits, the arrangement of the fibers must be such as to satisfy the dimensional stability and evenness requirements (bow and twist).

The ideal ratio for orientation of the fibers in the laminate varies from 50–80% of fibers at 0° to 50–20% at 90°.

This ratio is obtained by arranging the pre-preg layers so that they are crossed at 0° and 90°:

Alternation of the layers can be obtained by different ways:
1 layer at 0° with 1 at 90° over the entire thickness required;
2 layers at 0° with 2 at 90° over the entire thickness required;
2 layers at 0° on the outside with layers at 90° on the inside until the required thickness is achieved.

It has been established that the greatest overall stability is obtained with alternation of a number of layers which forms a sandwich structure.

During use of the pre-preg sheet as the bonding element in "masslams" it must be considered alternating the arrangement of the prep-preg sheet so that there is one at 0° and one at 90°.

According to the present invention, the sheets are manufactured using conventional procedures.

The resin used for the impregnation operations remains the same with further possibilities and advantages. The standard resin system (FR4-FR5) used for impregnation of the fabrics is a system containing 90% of epoxy resin of varying molecular weight, plus hardener and accelerating agent. The molecular weight of the resin is such that the resin is unable to wet the glass fabric; in this case the resin is diluted with solvents which lower its viscosity. UDF fabrics are much less interwoven than standard fabrics, such that the glass yarns are more open and consequently more easily wettable, and this results in the near absence of pockets or voids of air or solvent. It is thus possible to use more viscous resin systems with a considerable saving in solvent and energy used for evaporation of the solvent which must be completely removed from the impregnated fabric.

Moreover, this more easy wetting capability results in the possibility of using hot-melt resin systems which make use of the principle of lowering the viscosity of the resin system by means of heating. By avoiding the use of solvent, costly plants for dealing with the problem of a reduction in the harmful emissions released in the environment are no longer required.

The PWB sheets obtained with use of UDF fabrics result in a technological improvement in all the parameters which characterize the glass-reinforced resin sheets in the categories where the fabric is the main basic element.

Figure 2A:
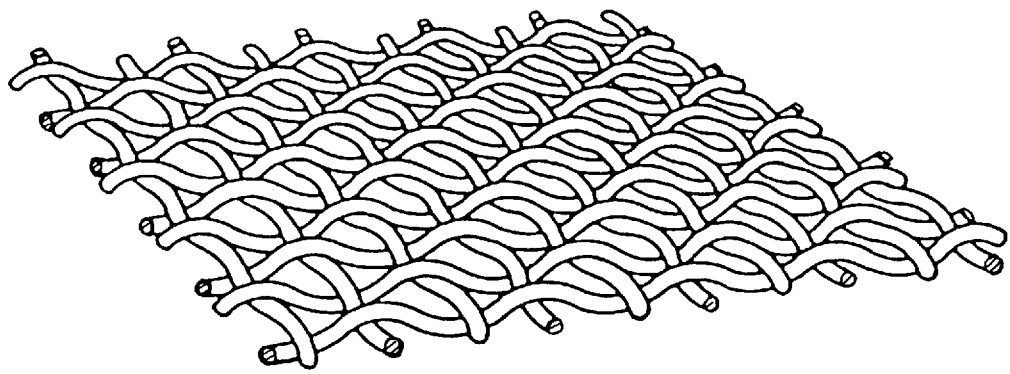
FIG. 2 shows in schematic form an axonometric and profile view of a conventional glass fabric.
Figure 2B:
Figure 3A:
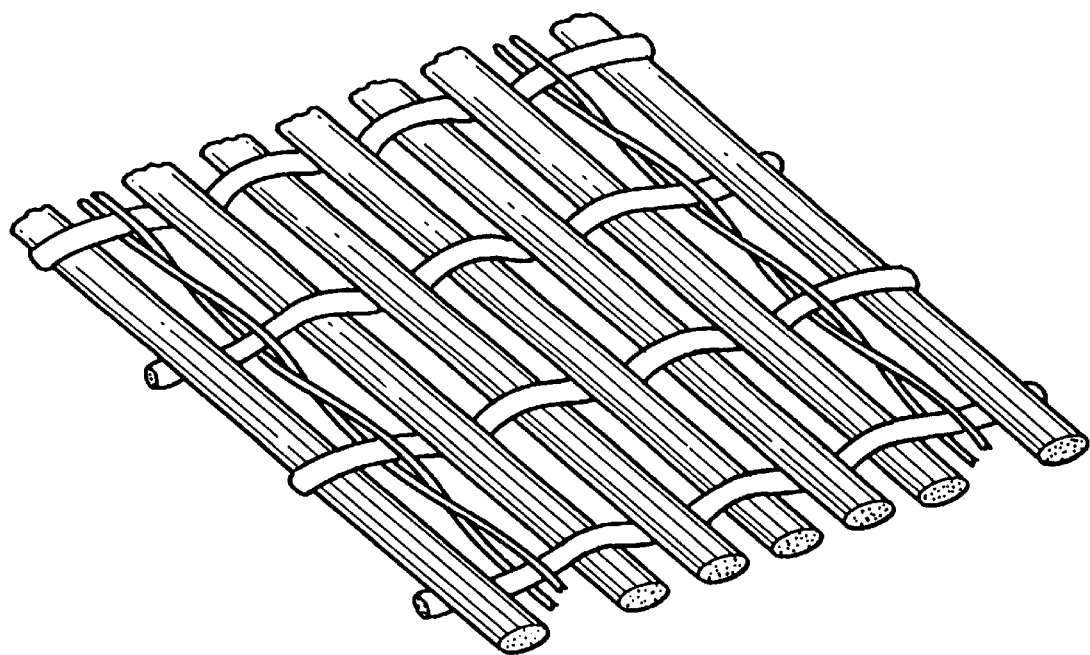
FIG. 3 shows in schematic form an axonometric and profile view of a unidirectional fabric used in the present invention.
Figure 3B:
Figure 3C:
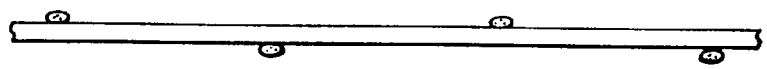

The surface roughness and waviness of the sheets is influenced by the structure of the underlying fabric. The standard fabric (see FIG. 2), on account of the higher number of intersections per cm, has a profile which cannot be less than the current values of 3 $\mu$m. The UDF fabric (see FIG. 3) has a markedly more linear profile which allows the surface of the sheet to be reduced below the value of 2 $\mu$m. With this value, the thickness of the copper, which will subsequently be the track of the printed circuit, may be reduced to below the value of 18 $\mu$m, as has already been necessary in the sector of high-frequency applications.

It will also be possible to perform direct application of thin copper tracks with economic and ecological advantages owing to the saving in copper and elimination of the etching operation which is performed with toxic acids.

The dimensional stability <50 ppm on the x and y axes is a consequence of the perfect alignment of the yarns and the extremely easy possibility of obtaining high percentages for the glass content.

The perforability of the laminate improves by 50% with regard to the duration of the tips used and the significant reduction in deviation of the hole. These two factors are negatively influenced by the lack of homogeneity of the resin/glass ratio existing in the sheets constructed using standard fabrics on account of the high number of intersections of yarns of large relative diameter (double that of UDF fabric).

The copper laid on the surface of the first layer of impregnated fabric, which is hardened and, when processing has been completed, forms the track of the printed circuit, has reproduced on it all the irregularities of the underlying fabric. In particular, the filaments of glass which project broken from the fabric constitute a "disturbance" which causes thinning and separation of the track, resulting in the rejection of material. This phenomenon, which is particularly dangerous, is markedly reduced on the surface of UDF fabrics owing to the presence of fewer yarn intersections which are the main cause of breakage of the glass-yarn filaments during the critical phase of weaving.

The warping of the sheets, caused by the tensions which are generated in a standard fabric with many intersections of yarns and wefts and which are produced with control of the distortion which only occasionally is less than 1.5%, diminishes substantially with the use of UDF fabrics owing to their very loose structure unaffected by distortion phenomena.

The glass-reinforced resin sheets according to the present invention are suitable for use in the production of printed circuits with high technological characteristics.

On the other hand, the use of UDF fabric with composite manufacturing technology may be applied in other industrial sectors such as the aeronautical and naval industries, for the elimination of "flaw" phenomena which are commonly encountered in the composite using unidirectional (UD) tape.

We claim:
1. Laminated sheets for use as a substrate for printed circuit boards, comprising:

(1) a plurality of layers of unidirectional glass fiber fabric sheets laminated together to form a laminate thereof, each said fabric sheet having:
  (a) continuous warp yarns which are twisted, have low numbers of twists or zero twisted and the warp yarns constituting at least 90% by weight of the sheet;
  (b) weft yarns with the number of weft yarns being up to 8 per cm;
  (c) leno interwoven interlacings interlaced in the warpwise direction with the weft yarns and having a Tex of about 5 to 22 with up to 20 cm spacing between adjacent interlacings; and
  (d) a laminating resin impregnated into the sheets; and
(2) orientation of the glass fibers in the laminate such that 50% to 80% by weight of the fibers are at 0° and 50% to 20% by weight of the fibers are at 90°.

2. Sheets according to claim 1, wherein the resin is an epoxy resin and comprises a hardener and an accelerating agent.

3. Sheets according to claim 1, wherein the laminate has layers of glass fabric oriented at 0° alternated with layers of glass fabric oriented at 90° singly over the entire thickness of the laminates.

4. Sheets according to claim 1, wherein the laminate has layers of glass fabric oriented at 0° alternated with layers of glass fabric oriented at 90° in pairs over the entire thickness of the laminates.

5. Sheets according to claim 1, wherein the laminate has two external layers of glass fabric oriented at 0° and internal layers of glass fabric oriented at 90°.

6. Sheets according to claim 1, wherein the layers of the sheets are arranged alternately so as to obtain a sandwich structure.

7. Sheets according to claim 1, wherein the pre-preg sheets are arranged alternately at 0° and 90°.

8. Sheets according to claim 1, wherein surface roughness of the laminate is less than 2 $\mu$m.

9. Sheets according to claim 1, wherein dimensional stability of the laminate is less than 50 ppm.

10. Sheets according to claim 1, wherein the undirectional glass fabric has filaments with a diameter of between 5 and 13 microns.

11. Sheets according to claim 1, wherein the unidirectional glass fabric has yarns with a Tex value of between 22 and 136.

12. Sheets according to claim 1, wherein the warp yarns have a Tex value of between 22 and 136 and the weft yarns have a Tex value of between 11 and 34.

* * * * *